United States Patent
Kim et al.

(10) Patent No.: US 9,793,423 B2
(45) Date of Patent: *Oct. 17, 2017

(54) LIGHT RECEIVING DEVICE INCLUDING TRANSPARENT ELECTRODE AND METHOD OF MANUFACTURING LIGHT RECEIVING DEVICE

(71) Applicant: KOREA UNIVERSITY RESEARCH AND BUSINESS FOUNDATION, Seoul (KR)

(72) Inventors: Tae Geun Kim, Seongnam-si (KR); Hee-Dong Kim, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 20 days.

This patent is subject to a terminal disclaimer.

(21) Appl. No.: 14/769,185

(22) PCT Filed: Jul. 30, 2013

(86) PCT No.: PCT/KR2013/006803
§ 371 (c)(1),
(2) Date: Aug. 20, 2015

(87) PCT Pub. No.: WO2014/133232
PCT Pub. Date: Sep. 4, 2014

(65) Prior Publication Data
US 2015/0380579 A1    Dec. 31, 2015

(30) Foreign Application Priority Data
Feb. 26, 2013 (KR) .................. 10-2013-0020685

(51) Int. Cl.
*H01L 31/0224* (2006.01)
*H01L 31/18* (2006.01)
*H01L 51/44* (2006.01)

(52) U.S. Cl.
CPC .. *H01L 31/022466* (2013.01); *H01L 31/1884* (2013.01); *H01L 51/444* (2013.01); *Y02E 10/549* (2013.01)

(58) Field of Classification Search
CPC ................................. H01L 31/022466
See application file for complete search history.

(56) References Cited

U.S. PATENT DOCUMENTS

| 2005/0045808 A1 | 3/2005 | Yonezawa et al. |
| 2010/0243295 A1* | 9/2010 | Allemand ............. B82Y 10/00 174/250 |

(Continued)

FOREIGN PATENT DOCUMENTS

| JP | 2007-250742 | 9/2007 |
| JP | 2012-195501 | 10/2012 |
| WO | 2011/025216 | 3/2011 |

OTHER PUBLICATIONS

Written Opinion with English translation for International Application No. PCT/KR2013/006803, dated Dec. 2, 2013.

(Continued)

*Primary Examiner* — Bethany L Martin
(74) *Attorney, Agent, or Firm* — Kile Park Reed & Houtteman PLLC

(57) ABSTRACT

Provided is a light receiving device including a transparent electrode and a method of manufacturing the light receiving device. A transparent electrode is formed so as to be in contact with a photoelectric conversion layer which absorbs light to generate electric energy, and the transparent electrode is formed by using a resistance change material which has high transmittance with respect to light in the entire wavelength range and of which resistance state is to be changed from a high resistance state into a low resistance state if a voltage exceeding a threshold voltage inherent in the resistance change material so that conducting filaments (Continued)

are formed in the transparent electrode. Accordingly, since the transparent electrode has high transmittance characteristic with respect to the light in the entire wavelength range and high conductivity characteristic, the light receiving device also has high photoelectric conversion efficiency and good electric characteristics.

6 Claims, 13 Drawing Sheets

(56) References Cited

U.S. PATENT DOCUMENTS

| | | | |
|---|---|---|---|
| 2011/0133649 A1* | 6/2011 | Kreiner | H05B 33/0842 |
| | | | 315/86 |
| 2012/0001218 A1* | 1/2012 | Choi | H01L 33/14 |
| | | | 257/98 |
| 2012/0280203 A1 | 11/2012 | Barwicz | |

OTHER PUBLICATIONS

International Search Report for International Application No. PCT/KR2013/006803, dated Dec. 2, 2013.

* cited by examiner

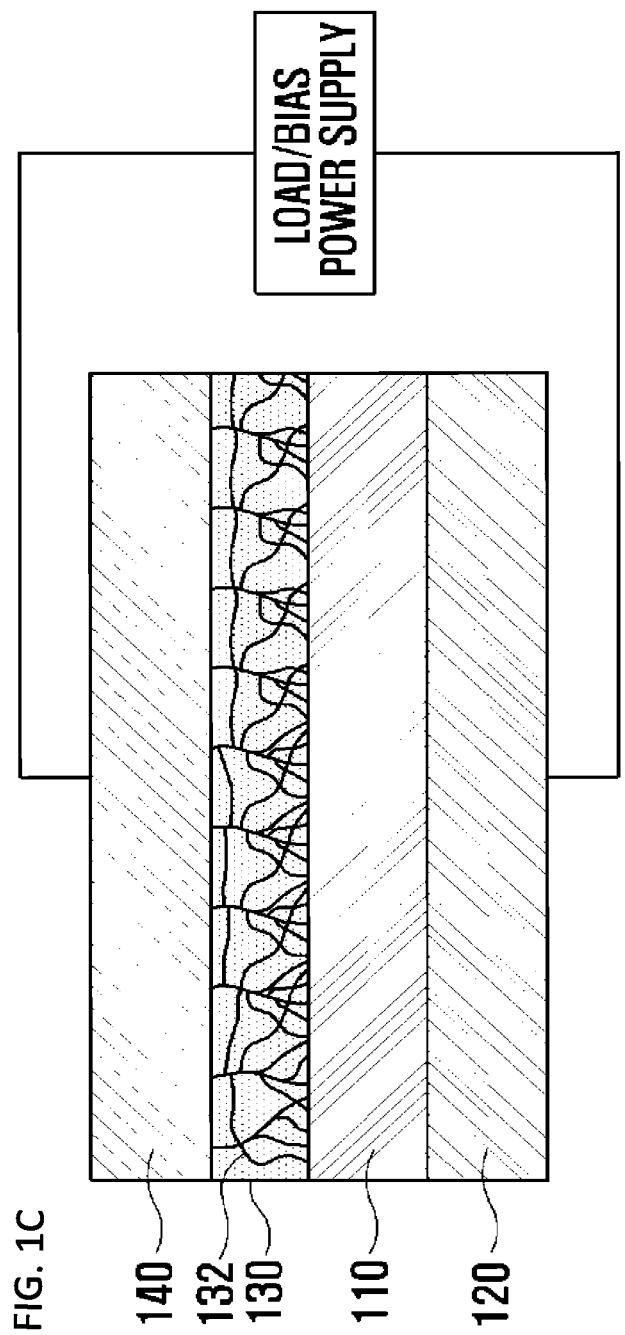

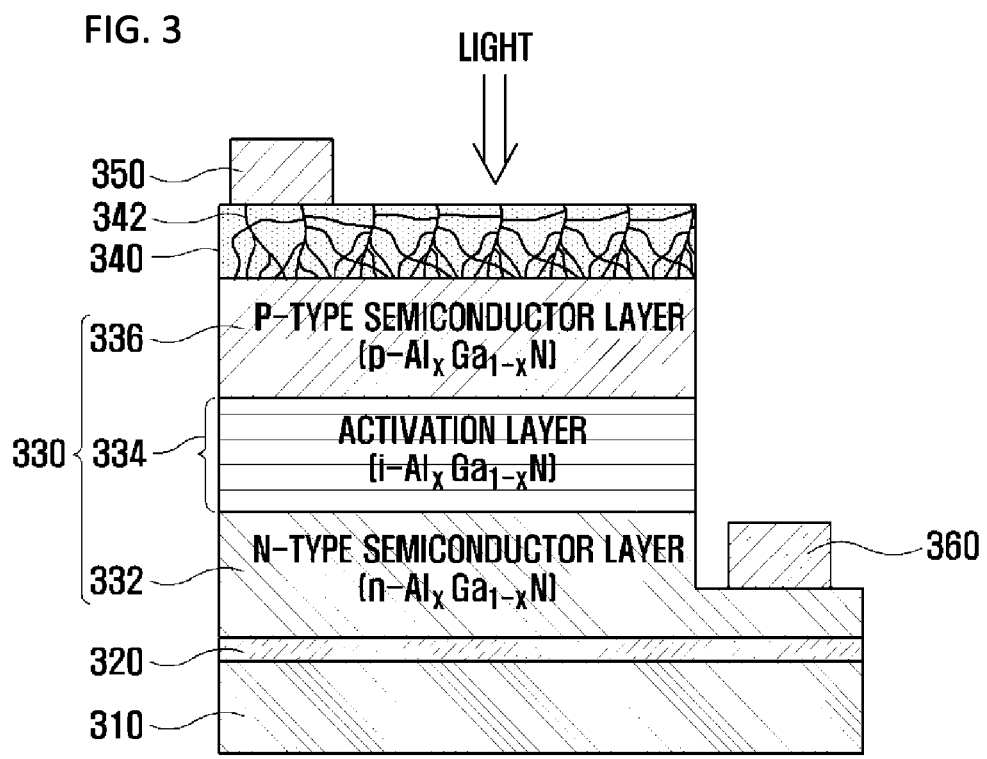

LIGHT RECEIVING DEVICE INCLUDING TRANSPARENT ELECTRODE AND METHOD OF MANUFACTURING LIGHT RECEIVING DEVICE

BACKGROUND OF THE INVENTION

1. Field of the Invention

The present invention relates to a light receiving device and a method of manufacturing the light receiving device, and more particularly, to a light receiving device including a transparent electrode and a method of manufacturing the light receiving device.

2. Description of the Related Art

In order to maximize energy efficiency of a light receiving device such as a solar cell or a photodiode which receives light, a transparent electrode having excellent transmittance characteristics with respect to light in a UV wavelength range as well as light in a visible wavelength range is required to be developed.

Currently, an ITO (indium tin oxide) transparent electrode is widely used as a transparent electrode of a light receiving device. However, the ITO transparent electrode is not in good ohmic contact with a semiconductor layer having a function as a photoelectric conversion layer which absorbs light to generate electric energy. Therefore, there is a problem in that electricity generation efficiency of the light receiving device is decreased. Particularly, since the ITO which is widely used in the light receiving device has high transmittance loss in a UV wavelength range of 400 nm or less, the ITO transparent electrode has a limitation in application to a UV light receiving device.

In order to solve the problem, a transparent electrode capable of allowing current to be smoothly injected by decreasing contact resistance between the transparent electrode and the semiconductor layer and having high transmittance characteristics with respect to light in the entire range needs to be developed.

Although various researches have been made in order to solve the above-described problems, a transparent electrode capable of implementing high transmittance and high conductivity with respect to light in a UV wavelength range has not been developed. This is because conductivity and transmittance of a material has a trade-off relationship. Since a material having as high transmittance as it can be used in a UV wavelength range has a large band gap (larger than the band gap (3.4 eV) of ITO), the material has too low conductivity to be used as an electrode and is not in ohmic contact with a semiconductor material. Therefore, it is impossible to use the material as an electrode.

Therefore, in order to implement the light receiving device such a high-efficiency solar cell or a high-efficiency photodiode capable of being used for the light in a UV wavelength range as well as the light in a visible wavelength range, a transparent electrode having high transmittance characteristics with respect to light in the entire wavelength range and having high conductivity characteristics so as to be in ohmic contact with a semiconductor layer needs to be developed.

SUMMARY OF THE INVENTION

The present invention is to provide a light receiving device including a transparent electrode having high transmittance characteristics with respect to light in the entire wavelength range and having high conductivity characteristics so as to be in ohmic contact with a semiconductor layer and a method of manufacturing the light receiving device.

According to an aspect of the present invention, there is provided a light receiving device including: a photoelectric conversion layer which absorbs light to generate electric energy; and a transparent electrode which is formed to be in contact with the photoelectric conversion layer to allow external light to transmit into the photoelectric conversion layer, wherein the transparent electrode is formed by using a transparent insulating material of which resistance state is to be changed from a high resistance state into a low resistance state by an applied electric field.

In the above aspect, a forming process may be performed on the transparent electrode by applying a threshold voltage or more inherent in a material of the transparent electrode, so that conducting filaments are formed in the transparent electrode.

In addition, in the above aspect, the transparent electrode may be formed by using any one of a transparent oxide based material, a transparent nitride based material, a transparent polymer based material, and a transparent nano material.

In addition, in the above aspect, the light receiving device may further include a current spreading layer which is formed by using CNT (carbon nano tube) or graphene between the photoelectric conversion layer and the transparent electrode.

In addition, in the above aspect, the light receiving device may further include a current spreading layer which is formed by using CNT or graphene and is in contact with a surface of the transparent electrode opposite to a surface of the transparent electrode which is in contact with the photoelectric conversion layer.

In addition, in the above aspect, the light receiving device may further include an opposite electrode which is formed to be in contact with a surface of the photoelectric conversion layer opposite to a surface of the photoelectric conversion layer which is in contact with the transparent electrode.

In addition, in the above aspect, the photoelectric conversion layer may be formed by sequentially forming a first semiconductor layer, an activation layer, and a second semiconductor layer which is in contact with the transparent electrode, a first electrode pad is formed on the first semiconductor layer, and a second electrode pad is formed on the transparent electrode.

According to another aspect of the present invention, there is provided a method of manufacturing a light receiving device including forming a transparent electrode which is in contact with a photoelectric conversion layer which absorbs light to generate electric energy, wherein the transparent electrode is formed by using a transparent insulating material of which resistance state is to be changed from a high resistance state into a low resistance state according to an applied electric field.

In the above aspect, a forming process may be performed on the transparent electrode by applying a threshold voltage or more inherent in a material of the transparent electrode, so that conducting filaments are formed in the transparent electrode.

In addition, in the above aspect, the transparent electrode may be formed by using any one of a transparent oxide based material, a transparent nitride based material, a transparent polymer based material, and a transparent nano material.

In addition, in the above aspect, the method may include: forming an opposite electrode on a substrate; forming the photoelectric conversion layer on the opposite electrode; and forming the transparent electrode on the photoelectric conversion layer and performing a forming process by applying a threshold voltage or more inherent in a material of the transparent electrode to the transparent electrode, so that the resistance state of the transparent electrode is changed into a low resistance state.

In addition, in the above aspect, the method may include: forming the transparent electrode a substrate and performing a forming process by applying a threshold voltage or more inherent in a material of the transparent electrode to the transparent electrode, so that the resistance state of the transparent electrode is changed into a low resistance state; forming the photoelectric conversion layer on the transparent electrode; and forming an opposite electrode on the photoelectric conversion layer.

In addition, in the above aspect, in the forming of the transparent electrode, a current spreading layer may be formed by using CNT (carbon nano tube) or graphene so as to be in contact with an upper or lower surface of the transparent electrode.

In the present invention, a transparent electrode is formed so as to be in contact with a photoelectric conversion layer which absorbs light to generate electric energy, and the transparent electrode is formed by using a resistance change material which has high transmittance with respect to light in the entire wavelength range and of which resistance state is to be changed from a high resistance state into a low resistance state if a voltage exceeding a threshold voltage inherent in the resistance change material so that conducting filaments are formed in the transparent electrode.

Accordingly, since the transparent electrode has high transmittance characteristic with respect to the light in the entire wavelength range and high conductivity characteristic, the light receiving device according to the present invention also has high photoelectric conversion efficiency and good electric characteristics.

BRIEF DESCRIPTION OF THE DRAWINGS

The above and other features and advantages of the present invention will become more apparent by describing in detail exemplary embodiments thereof with reference to the attached drawings in which:

FIGS. 1a to 1c are diagrams illustrating a configuration of a light receiving device according to an embodiment of the present invention;

FIG. 3 is a diagram illustrating an example where the light receiving device according to the embodiment of the present invention is constructed with a UV photodiode;

DETAILED DESCRIPTION OF THE INVENTION

Hereinafter, exemplary embodiments of the present invention will be described with reference to the attached drawings.

Figure 1A:
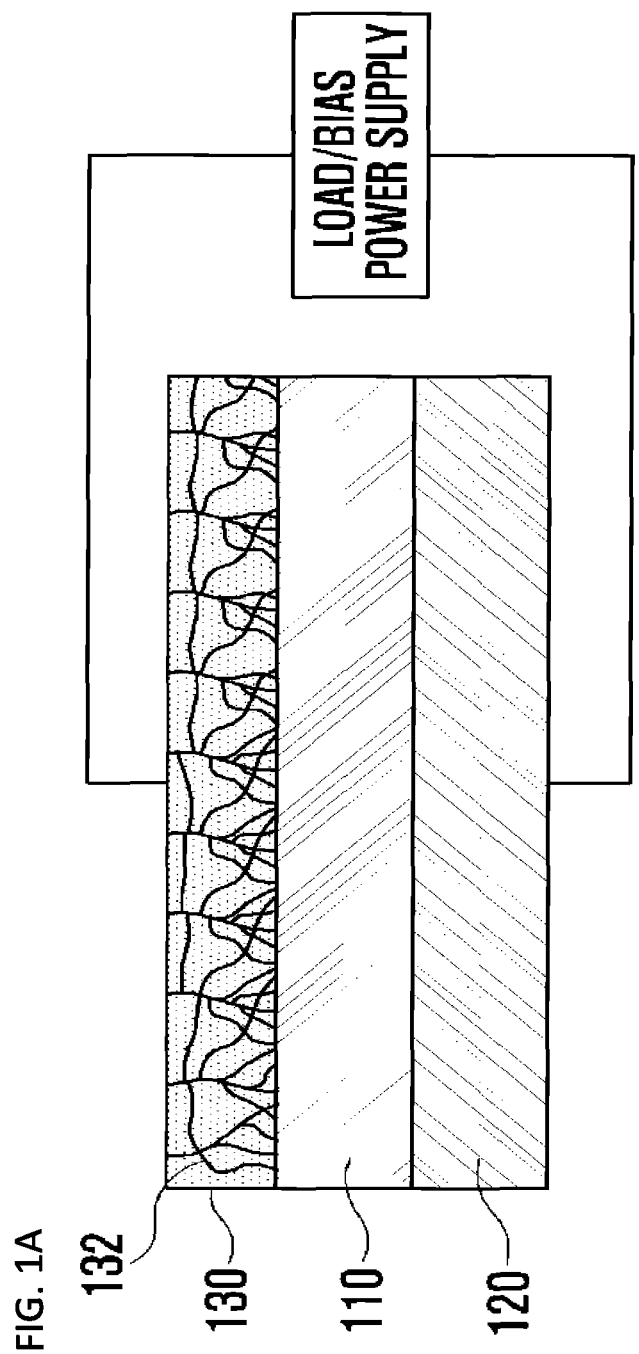

FIG. 1a is a diagram illustrating a configuration of a light receiving device including a transparent electrode 130 according to an embodiment of the present invention.

Referring to FIG. 1a, the light receiving device according to the embodiment of the present invention is configured so that a photoelectric conversion layer 110 which absorbs light to converts the light into electric energy is interposed between a transparent electrode 130 and an opposite electrode 120.

The photoelectric conversion layer 110 absorbs light and generates electron-hole pairs to converts optical energy into electric energy according to the photoelectric conversion effect. The light receiving device may be implemented in various structures, for example, a PN junction structure or a PIN layer structure. In the PIN layer structure, a p-type semiconductor layer and an n-type semiconductor layer are attached to two surfaces of an i-type semiconductor layer which is an intrinsic semiconductor layer.

The opposite electrode 120 is formed so as to correspond to the below-described transparent electrode 130. In general, the opposite electrode 120 may be formed in the same manner as an electrode used in a solar cell, a photodiode, or the like. Two electrodes are needed for a light receiving device. The one of the two electrodes becomes the transparent electrode 130, and the other becomes the opposite electrode 120. Therefore, it should be noted that the positional relationship between the opposite electrode 120 and the transparent electrode 130 is not an essential feature of the present invention.

The transparent electrode 130 allows external light to transmit through the transparent electrode 130 so as to apply the light to a photoelectric conversion layer 110. The transparent electrode 130 is constructed with a transparent material (resistance change material) which has high transmittance with respect to light including light in a UV wavelength range and of which resistance state is to be changed according to an applied electric field. The resistance change material is mainly used in the field of ReRAM (resistive RAM). If a threshold voltage or more inherent in the material is applied to the material, electrical break-down phenomenon occurs and electro-forming is performed, the resistance state of the resistance change material which is originally an insulating material is changed from a high resistance state into a low resistance state, so that the material has a conductivity.

More specifically, if a threshold voltage or more is applied to the resistance change material which is an insulating material, electrode metal materials are inserted into a thin film due to electric stress (forming process), or a defective structure occurs in the thin film, so that conducting filaments 132 (or, metallic filaments) are formed in the resistance change material as illustrated in FIG. 1a. After that, although the voltage applied to the material is removed, the conducting filaments 132 remain, and current can flow through the conducting filaments 132, so that the low resistance state of the material is maintained.

Figure 2A:
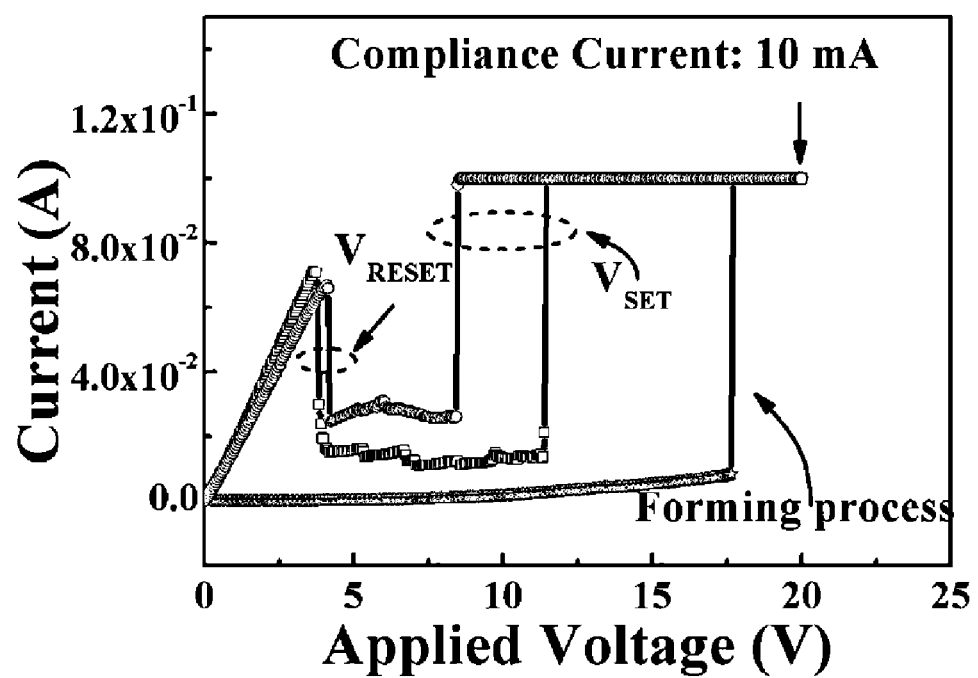
FIGS. 2a and 2b are diagrams illustrating characteristics of a resistance change material.

Referring to FIG. 2a, it can be seen that the resistance change material (for example, AlN) has an insulating characteristic before the forming process and has an I-V characteristic of a metal after the forming process.

Figure 2B:
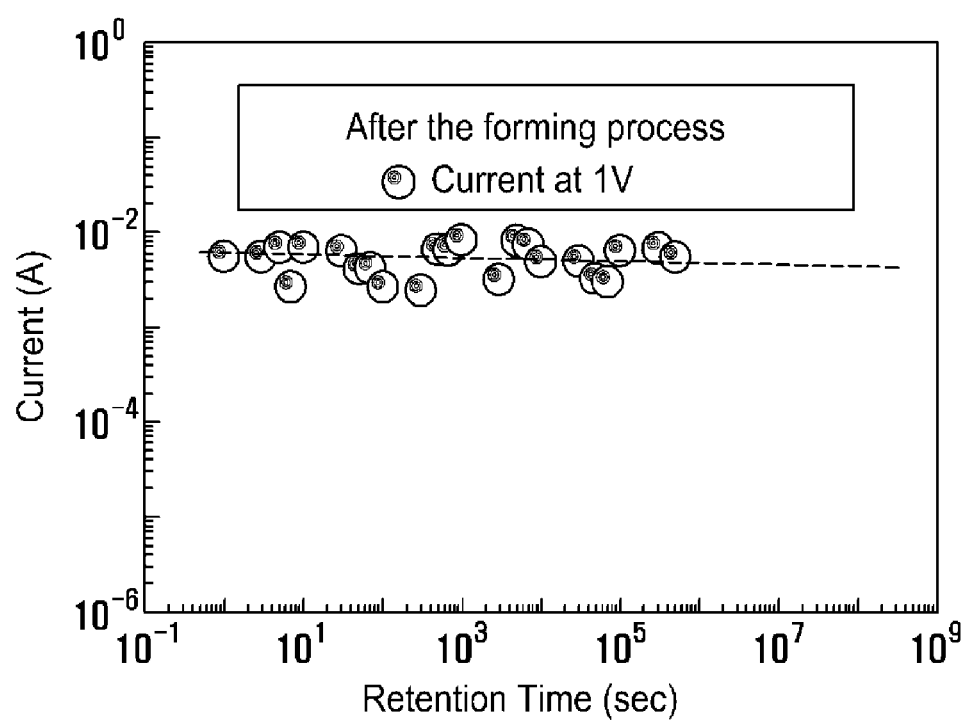

FIG. 2b is a graph illustrating how long the resistance state can be stably maintained after the conducting filaments 132 are formed. It can be seen from a dotted line in the graph that the low resistance state can be stably maintained for ten years after the conducting filaments 132 are formed.

In the embodiment of the present invention, a transparent conductive oxide based material ($SiO_2$, $Ga_2O_3$, $Al_2O_3$, ZnO, ITO, or the like), a transparent conductive nitride based material ($Si_3N_4$, AlN, GaN, InN, or the like), a transparent conductive polymer based material (polyaniline (PANI)), poly(ethylenedioxythiophene)-polystyrene sulfonate (PEDOT: PSS) or the like), and a transparent conductive nano material (CNT, CNT-oxide, Graphene, Graphene-oxide, or the like) or the like may be used as the resistance change material. In addition to the above-described materials, any material which is transparent and has the above-described resistance change characteristic can be used to form the transparent electrode 130 according to the present invention. It should be noted that the statement that the material has conductivity denotes that the material is allowed to have conductivity as a result of the forming process according to the electro break-down phenomenon, by which the conducting filaments 132 are formed in the transparent electrode. In addition, it should be noted that the forming process is performed on the transparent electrode 130 according to the present invention, so that the conducting filaments are formed in the transparent electrode.

A method of manufacturing the light receiving device according to the embodiment of the present invention is described in brief. First, the opposite electrode 120 is formed on a substrate (not shown), and the photoelectric conversion layer 110 is formed on the opposite electrode 120. The photoelectric conversion layer 110 may be formed in a PN junction structure or a PIN layer structure. In the PIN layer structure, a p-type semiconductor layer and an n-type semiconductor layer are attached to two surfaces of an i-type semiconductor layer which is an intrinsic semiconductor layer.

Next, the transparent electrode 130 is formed on the photoelectric conversion layer 110 by using a resistance change material. If a threshold voltage or more inherent in a resistance change material of the transparent electrode is applied to the resistance change material, electrical break down phenomenon occurs and the forming process is performed, so that the conducting filaments 132 are formed in the transparent electrode 130. In addition, an electrode pad may be formed on the one side of the transparent electrode 130.

On the other hand, in the above-described method of manufacturing the light receiving device, the opposite electrode 120 is formed on the substrate. However, it should be noted that, after the transparent electrode 130 is formed on a transparent substrate such as a transparent glass by using a resistance change material and the conducting filaments 132 are formed by performing the forming process, the photoelectric conversion layer 110 and the opposite electrode 120 may be formed thereon in this order.

In addition, in order to improve the current spreading characteristics of the transparent electrode 130, a current spreading layer formed by using CNT (carbon nano tube) or graphene which connects the conducting filaments 132 formed in the transparent electrode 130 may be additionally formed on an upper or lower surface of the transparent electrode 130.

Figure 1B:
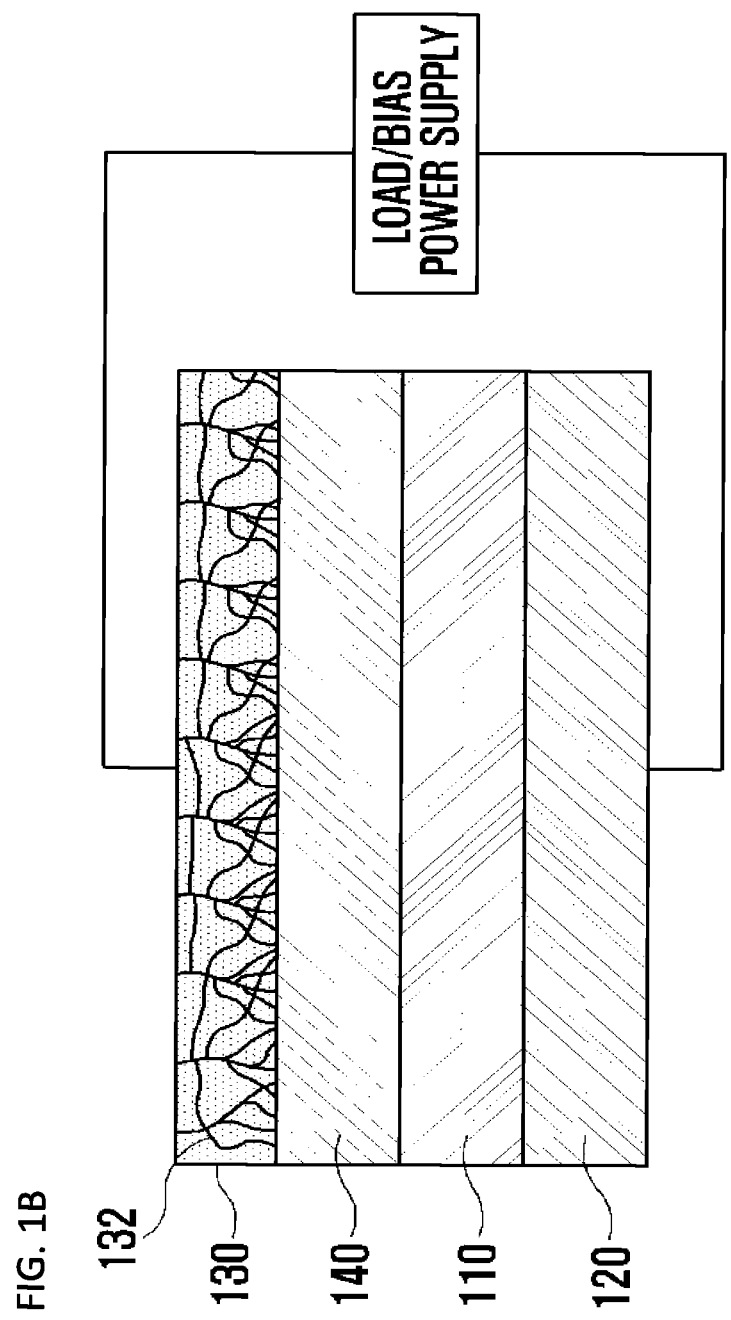

FIG. 1b illustrates an example where the current spreading layer 140 formed by using CNT or graphene is formed between the transparent electrode 130 and the photoelectric conversion layer 110. FIG. 1c illustrates an example where the current spreading layer 140 formed by using CNT or graphene is formed on a surface opposite to the surface of the transparent electrode 130 which is in contact with the photoelectric conversion layer 110.

The CNT and graphene have good conductivity and transmittance characteristics. In the present invention, the conducting filaments 132 in the transparent electrode 130 are connected to each other by forming the current spreading layer 140 by using CNT or graphene on one surface of the transparent electrode 130 by using the characteristics, so that the current flowing through the light receiving device can be allowed to spread over the entire area.

At this time, as the thickness of the current spreading layer 140 is increased, CNTs and graphenes are connected to each other, and thus, the possibility that the conducting filaments 132 are connected to each other is increased. As a result, the conductivity of the transparent electrode 130 is increased, but the transmittance thereof is decreased. Therefore, it is preferable that the current spreading layer 140 according to the present invention are formed with a thickness enough to connect the conducting filaments 132 in the transparent electrode 130 to each other and as thin as possible within a range where the transmittance is not deteriorated.

Hereinbefore, the light receiving device including the transparent electrode according to the embodiment of the present invention and the method of manufacturing the light receiving device are described with reference to FIG. 1a to FIG. 2b. Hereinafter, the embodiments where the light receiving device is applied to a UV photodiode to a solar cell will be described. However, it should be noted that the below-described structures of the UV photodiode and the solar cell are basically included in the structure of the light receiving device described with reference to FIG. 1a.

FIG. 3 is a diagram illustrating an example where the light receiving device according to the embodiment of the present invention is constructed with a UV photodiode.

Referring to FIG. 3, in the UV photodiode according to the embodiment of the present invention, a buffer layer 320, an n-type semiconductor layer 332, an activation layer (intrinsic semiconductor layer) 334, a p-type semiconductor layer 336 are formed on a sapphire substrate 310 in this order. A transparent electrode 340 is formed on the p-type semiconductor layer 336, and a p-type electrode pad 350 is formed on the transparent electrode 340. In addition, one side surface of the n-type semiconductor layer 332 is exposed by etching, and an n-type electrode pad 360 is formed thereon so as to be in contact with the n-type semiconductor layer 332.

In the embodiment of the present invention, the buffer layer 320 is formed with a GaN layer; the n-type semiconductor layer 332 is formed with an n-$Al_xGa_{1-x}N$ layer; the activation layer 334 is formed with an i-$Al_xGa_{1-x}N$ layer; and the p-type semiconductor layer 336 is formed with a p-$Al_xGa_{1-x}N$ layer.

As described above, the transparent electrode 340 has high transmittance with respect to the light in a UV wavelength range as well as the light in a visible range. In addition, if a threshold voltage or more inherent in the transparent electrode 340 which is formed by using a resistance change material is applied to the transparent electrode 340, electrical break-down phenomenon occurs and the forming process is performed, so that the conducting filaments 342 are formed in the transparent electrode 340. Therefore, the transparent electrode 340 has high conductivity, so that the transparent electrode 340 is in good ohmic contact with the p-type semiconductor layer 336.

In the UV photodiode in the related art, a metal electrode pad is directly formed on the p-type semiconductor layer without a transparent electrode. Since a very large band gap is formed between the metal electrode pad and the p-type semiconductor layer, there is a problem in that the ohmic characteristic is greatly deteriorated. In order to solve the problem of deterioration in the ohmic characteristic, a method of forming a large-area metal electrode is proposed. However, in this case, since the area of the semiconductor layer into which light is transmitted is greatly decreased, there is a problem in that performance of the entire photodiode is deteriorated.

According to the embodiment of the present invention, as described above, the conducting filaments 342 are formed in the transparent electrode 340, so that the conductivity of the transparent electrode 340 can be greatly improved. Therefore, it is possible to implement the transparent electrode 340 having high transmittance characteristic and good ohmic contact characteristic with respect to the p-type semiconductor layer 336.

Figure 4:
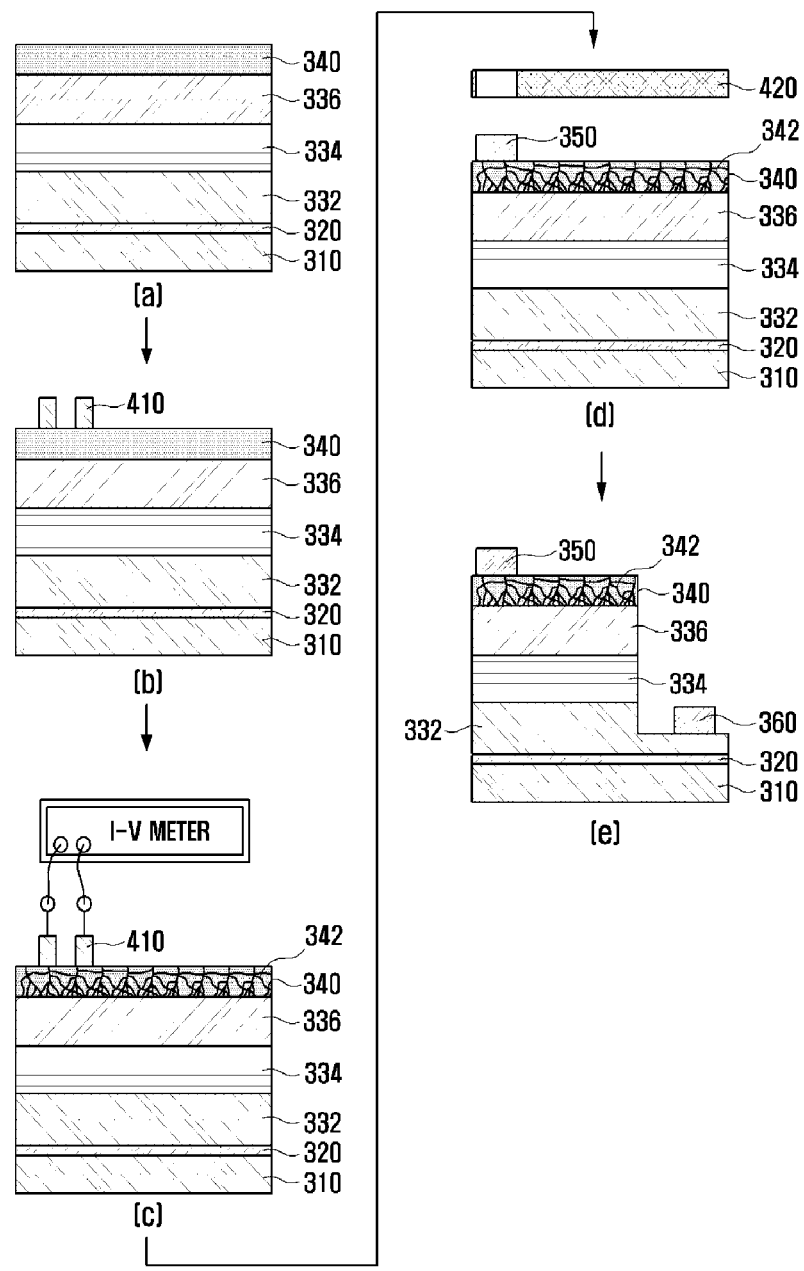
FIG. 4 is a diagram illustrating processes of manufacturing the UV photodiode according to the embodiment of the present invention.

FIG. 4 is a diagram illustrating processes of manufacturing the UV photodiode according to the embodiment of the present invention.

Referring to FIG. 4, a buffer layer 320 (GaN layer), an n-type semiconductor layer 332 (n-$Al_xGa_{1-x}N$ layer), an activation layer 334 (intrinsic semiconductor layer: i-$Al_xGa_{1-x}N$ layer), and a p-type semiconductor layer 336 (p-$Al_xGa_{1-x}N$ layer) are formed on the sapphire in this order. The processes of forming the buffer layer 320 to the p-type semiconductor layer 336 on the sapphire substrate 310 are the same as general UV photodiode manufacturing processes, and thus, the detailed description thereof is omitted. Next, a transparent electrode 340 is formed by using a resistance change material on the p-type semiconductor layer 336 (refer to (a) of FIG. 4).

After the transparent electrode is formed, a photoresist layer (not shown) is formed on the transparent electrode 340, and a pattern for forming the forming electrode 410 is formed on a portion of the area of the photoresist layer where a p-type metal pad is to be formed by performing a photolithography process. Next, by performing an e-beam process, a sputtering process, or other metal deposition processes, the forming electrode 410 is formed in the pattern. Next, the forming electrode 410 is completed by removing the photoresist layer except for the forming electrode 410 through a lift-off process (refer to (b) of FIG. 4).

Next, if a threshold voltage or more inherent in the material is applied to the forming electrode 410 formed on the transparent electrode 340, the forming process caused by the electrical break-down is performed, so that the conducting filaments 342 are formed in the transparent electrode 340 which is an insulating material. Accordingly, the resistance state of the transparent electrode 340 is changed from a high resistance state into a low resistance state (refer to (c) of FIG. 4).

After the conducting filaments 342 are formed in the transparent electrode 340, a p-type metal electrode pad is formed on the transparent electrode 340 (refer to (d) of FIG. 4). At this time, as a method of forming the p-type electrode pad 350, the forming electrode 410 for performing the forming process may be removed, and a separate metal electrode pad may be formed. Alternatively, metal is additionally deposited on the forming electrode 410 using a mask 420, so that the p-type metal electrode pad may be formed.

Next, the p-type semiconductor layer 336 and the activation layer 334 are sequentially etched from the transparent electrode 340 so as to allow the n-type semiconductor layer 332 to be exposed, and an n-type electrode pad is formed on the n-type semiconductor layer 332, so that a UV photodiode is completed (refer to (e) of FIG.).

In the embodiment described hereinbefore with reference to FIGS. 3 and 4, the photoelectric conversion layer 330 is configured to include the n-type semiconductor layer 332, the activation layer 334 (intrinsic semiconductor layer), and the p-type semiconductor layer 336. However, the photoelectric conversion layer 330 may be configured with only the PN junction.

Hereinbefore, the UV photodiode according to the embodiment of the present invention and the method of manufacturing the UV photodiode are described.

In the embodiment described with reference to FIGS. 3 and 4, some conducting filaments 342 formed in the transparent electrode 340 may not be connected to other conducting filaments 342.

Figure 5A:
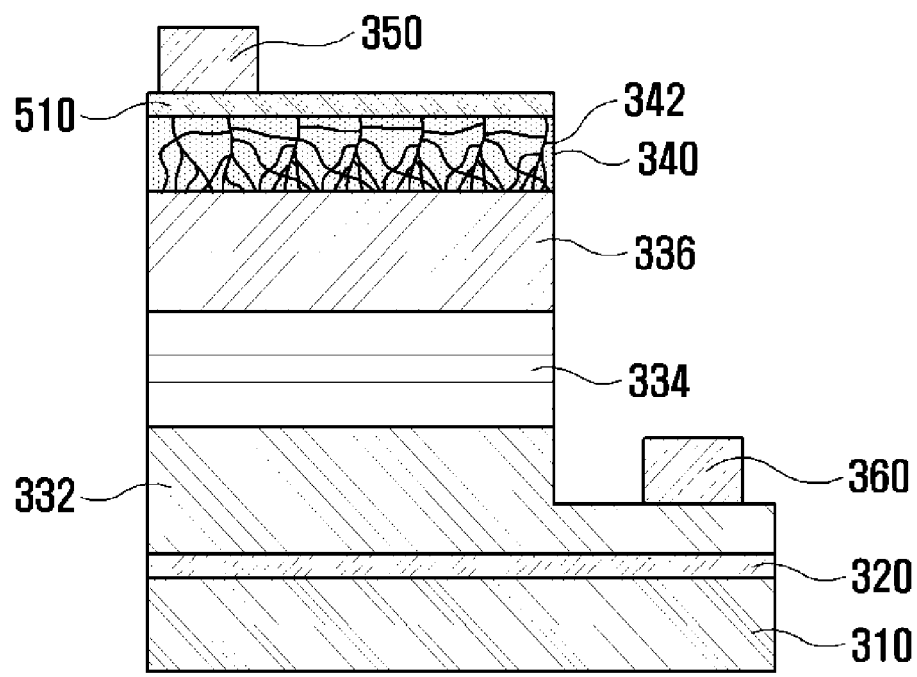
FIGS. 5a and 5b are diagrams illustrating UV photodiodes according to modified examples of the embodiment of the present invention.
Figure 5B:
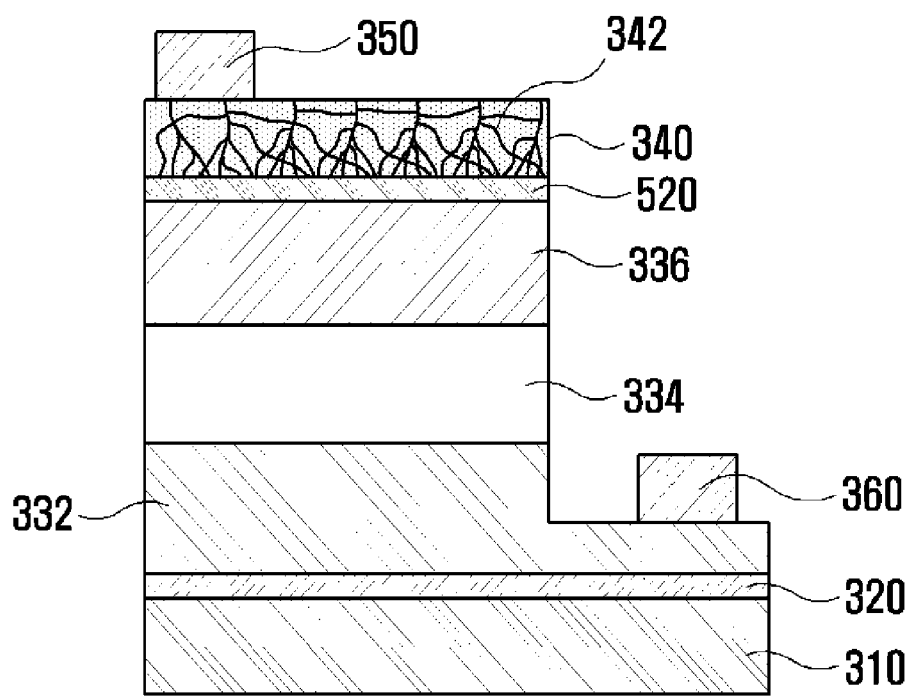

FIGS. 5a and 5b are diagrams illustrating UV photodiodes according to modified examples of the embodiment of the present invention in order to solve the above problem.

In the examples illustrated in FIGS. 5a and 5b, in order to improve the current spreading characteristic of the transparent electrode 340, a current spreading layer 510 or 520 formed by using CNT (carbon nano tube) or graphene which connects the conducting filaments 342 formed in the transparent electrode 340 are formed on an upper surface or a lower surface of the transparent electrode 340.

FIG. 5a illustrates an example where the current spreading layer 510 formed by using CNT or graphene is formed on the transparent electrode 340. FIG. 5b illustrates an example where the current spreading layer 520 formed by using CNT or graphene is formed between the transparent electrode 340 and the p-type semiconductor layer 336.

The CNT and graphene have good conductivity and transmittance characteristics. In the present invention, the conducting filaments 342 in the transparent electrode 340 are connected to each other by forming the current spreading layer 510 or 520 by using CNT or graphene on one surface of the transparent electrode 340 by using the characteristics, so that the current flowing into the transparent electrode 340 can be allowed to spread over the entire photoelectric conversion layer 330.

At this time, as the thickness of the current spreading layer 510 or 520 is increased, the CNTs and graphenes are connected to each other, and thus, the possibility that the conducting filaments 342 are connected to each other is increased. As a result, the conductivity of the transparent electrode 340 is increased, but the transmittance thereof is decreased. Therefore, it is preferable that the current spreading layer 510 or 520 according to the present invention is formed with a thickness enough to connect the conducting filaments 342 in the transparent electrode 340 to each other and as thin as possible within a range where the transmittance is not deteriorated.

In the embodiment of the present invention illustrated in FIGS. 5a and 5b, the current spreading layers 510 and 520 are formed with a thickness of about 2 nm to about 100 nm. The thickness of 2 nm is a minimum thickness so that a single layer of CNT or graphene can be formed, and the thickness of 100 nm is a maximum thickness so that transmittance can be maintained to be 80% or more.

The manufacturing process of the example illustrated in FIG. 5a is the same as that of FIG. 4 except that the current spreading layer 510 is formed by using CNT or graphene just after the conducting filaments 342 are formed in the transparent electrode 340 by performing the forming process, and the p-type electrode pad 350 is formed on the current spreading layer 510.

The manufacturing process of the example illustrated in FIG. 5b is the same as that of FIG. 4 except that the current spreading layer 520 is formed by using CNT or graphene on the p-type semiconductor layer 336 after the p-type semiconductor layer 336 is formed, and the transparent electrode 340 is formed on the current spreading layer 520.

Hereinbefore, the example where the light receiving device according to the embodiment of the present invention is applied to an UV photodiode is described with reference to FIGS. 3 to 5b. The structure of the photodiode in the related art used in a visible wavelength range is the same as that of the solar cell described below with reference to FIGS. 6 to 7b, and thus, the detailed description thereof is omitted.

Figure 6:
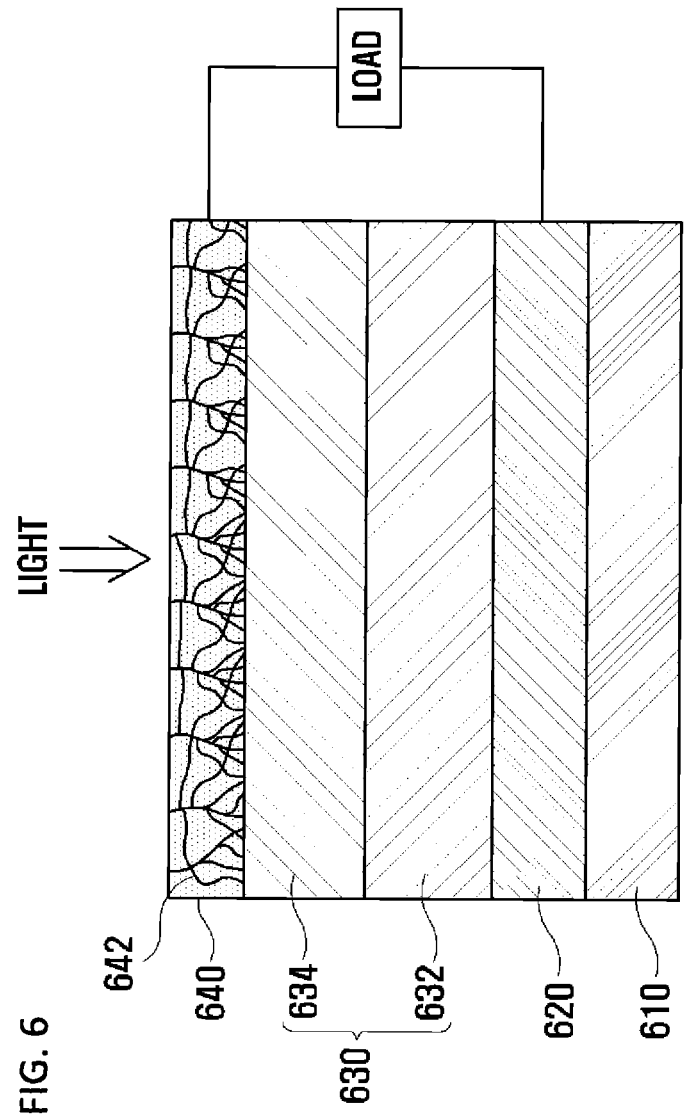
FIG. 6 is a diagram illustrating an example where the light receiving device according to the embodiment of the present invention is constructed with a solar cell.

FIG. 6 is a diagram illustrating an example where the light receiving device according to the embodiment of the present invention is constructed with a solar cell.

Referring to FIG. 6, the solar cell according to the embodiment of the present invention has a structure where a transparent electrode 640 and an opposite electrode 620 are attached on two surfaces of a photoelectric conversion layer 630. In this case, a supporting substrate 610 such as a glass substrate may be formed to be in contact with the transparent electrode 640 or the opposite electrode 620.

As illustrated in FIG. 6, the photoelectric conversion layer 630 may be formed in a PN junction structure or with a pin junction layer formed by attaching n-type, i-type, and p-type semiconductor layers. In the example illustrated in FIG. 6, the transparent electrode 640 is in contact with a p-type semiconductor layer 634, and the opposite electrode 620 is in contact with an n-type semiconductor layer 632. Alternatively, the transparent electrode 640 may be in contact with the n-type semiconductor layer, and the opposite electrode 620 may be in contact with the p-type semiconductor layer.

The operations of the solar cell illustrated in FIG. 6 are described in brief. External light (light of the Sun) incident on the transparent electrode 640 is transmitted through the transparent electrode 640 into the photoelectric conversion layer 630. The photoelectric conversion layer 630 converts the energy of the light to generate electron-hole pairs. Due to the electric field generated at the PN junction, the holes (+) are moved toward the p-type semiconductor layer, and the electrons (−) are moved toward the n-type semiconductor layer, so that the potential difference occurs.

Similarly to the transparent electrode 130 340 illustrated in FIGS. 1a and 3, the transparent electrode 640 is formed by using a resistance change material. If a threshold voltage or more inherent in the resistance change material is applied to the material, electrical break-down phenomenon occurs and the forming process is performed, so that the conducting filaments 642 are formed. Therefore, the transparent electrode 640 illustrated in FIG. 6 has high transmittance characteristic with respect to the light in a UV wavelength range as well as the light in a visible wavelength range and high conductivity characteristic due to the conducting filaments 642.

Figure 7:
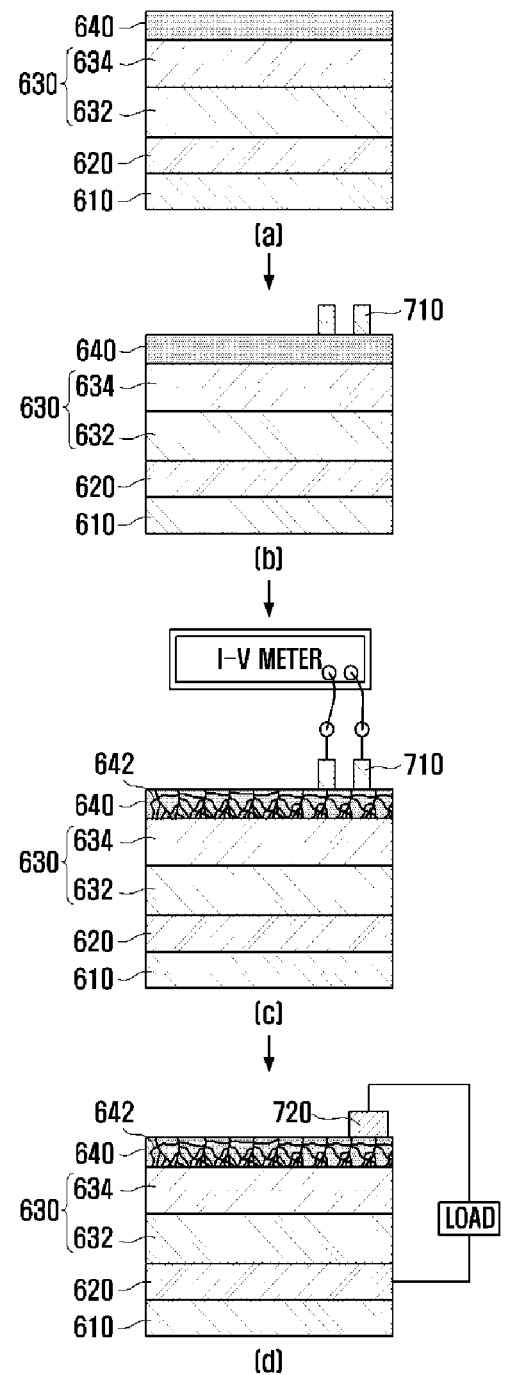
FIG. 7 is a diagram illustrating processes of manufacturing the solar cell including a transparent electrode according to the embodiment of the present invention.

FIG. 7 is a diagram illustrating processes of manufacturing the solar cell including the transparent electrode 640 according to the embodiment of the present invention.

Referring to FIG. 7, first, by using the same method as a method of manufacturing a general solar cell, an opposite electrode 620 and a photoelectric conversion layer 630 are formed on a substrate, and a transparent electrode 640 is formed by using a resistance change material so as to be in contact with the photoelectric conversion layer 630 (refer to (a) of FIG. 7).

Next, a photoresist layer (not shown) is formed on the transparent electrode 640, and a pattern for forming the forming electrode 710 is formed on the photoresist layer by performing a photolithography process. Next, by performing an e-beam process, a sputtering process, or other metal deposition processes, the forming electrode 710 is formed in the pattern. Next, the forming electrode 710 is completed by removing the photoresist layer except for the forming electrode 710 through a lift-off process (refer to (b) of FIG. 7).

Next, if a threshold voltage or more inherent in the material is applied to the forming electrode 710 formed on the transparent electrode 640, the forming process caused by the electrical break-down is performed, so that the conducting filaments 642 are formed in the transparent electrode 640 which is an insulating material. Accordingly, the resistance state of the transparent electrode 640 is changed from a high resistance state into a low resistance state (refer to (c) of FIG. 7).

After the conducting filaments 642 is formed in the transparent electrode 640, an electrode pad 720 is formed on the transparent electrode 640 (refer to (d) of FIG. 7). At this time, as a method of forming the electrode pad 720, the forming electrode 710 for performing the forming process may be removed, and a separate metal electrode pad may be formed. Alternatively, metal is additionally deposited on the forming electrode 710 by using a mask (not shown), so that the electrode pad 190 may be formed.

Figure 8A:
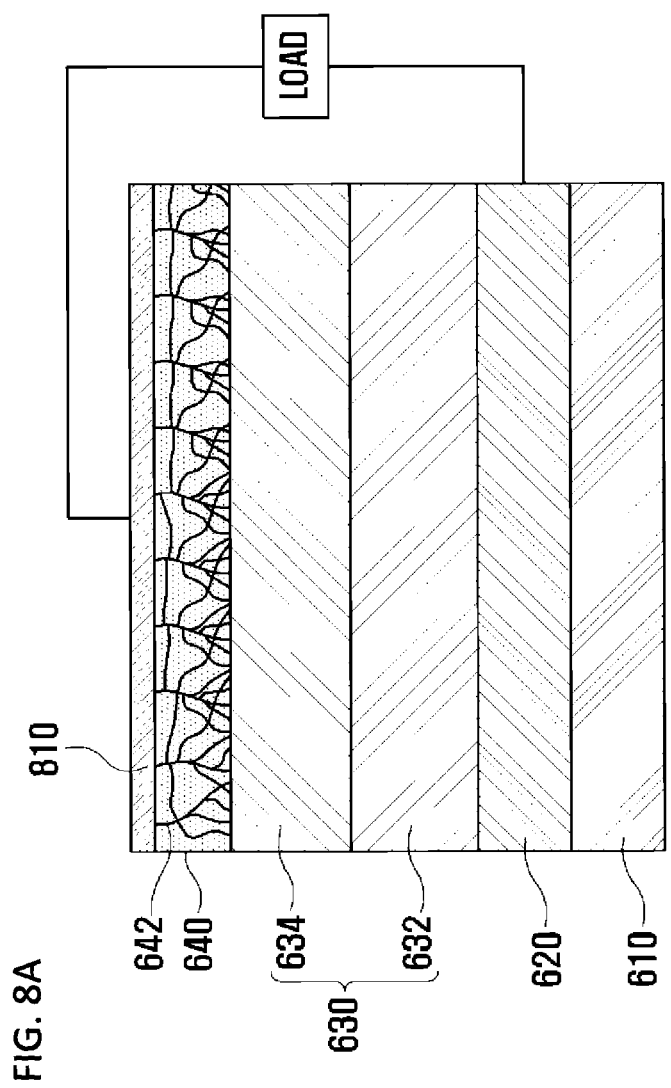
FIGS. 8a and 8b are diagrams illustrating a solar cell according to another embodiment of the present invention.
Figure 8B:
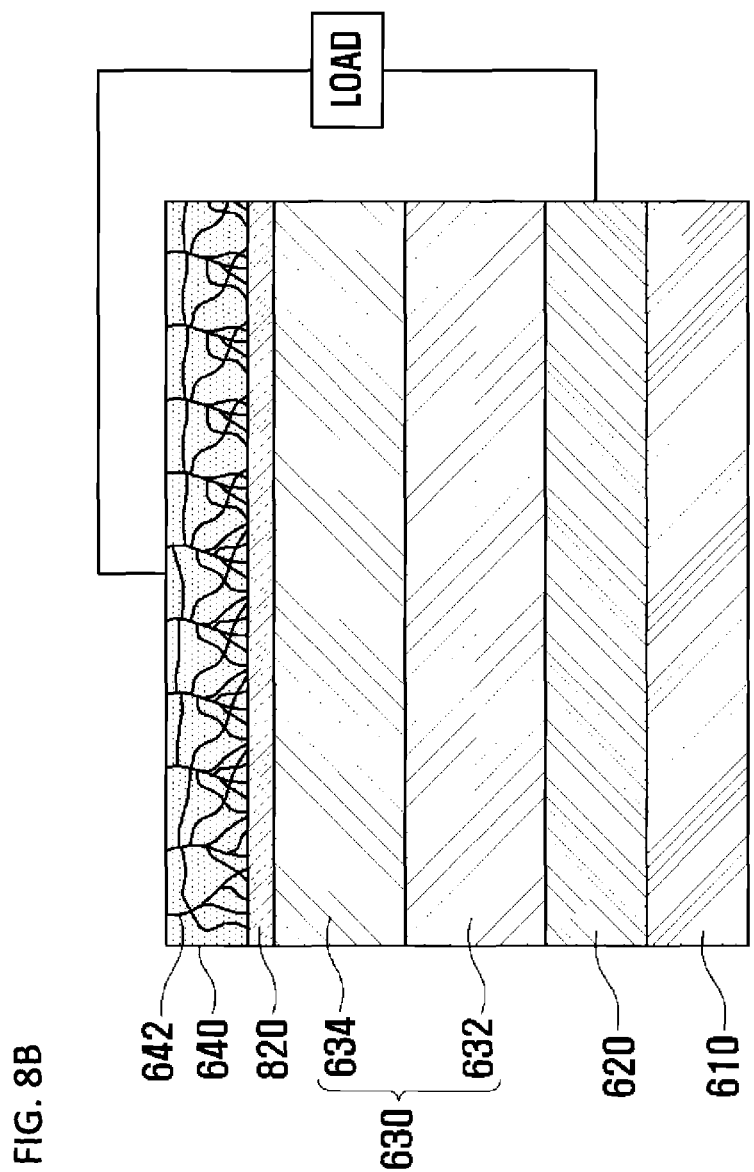

FIGS. 8a and 8b are diagrams illustrating solar cells according to examples of another embodiment of the present invention.

In the examples illustrated in FIGS. 8a and 8b, in order to improve the current spreading characteristics of the transparent electrode 640, a current spreading layer 810 or 820 formed by using CNT (carbon nano tube) or graphene which connects the conducting filaments 642 formed in the transparent electrode 640 is formed on an upper or lower surface of the transparent electrode 640.

FIG. 8a illustrates an example where the current spreading layer 810 formed by using CNT or graphene is formed on the transparent electrode 640. FIG. 8b is illustrates an example where the current spreading layer 820 formed by using CNT or graphene is formed between the transparent electrode 640 and the photoelectric conversion layer 630.

The manufacturing processes of the example illustrated in FIG. 8a are the same as those of the example described with reference to FIG. 7 except that the current spreading layer 810 is formed by using CNT or graphene just after the conducting filaments 642 are formed in the transparent electrode 630 by performing the forming process.

The manufacturing processes of the example illustrated in FIG. 8b are the same as those of the example described with reference to FIG. 7 except that the current spreading layer 820 is formed by using CNT or graphene on the photoelectric conversion layer 630 after the photoelectric conversion layer 630 is formed, and the transparent electrode 640 is formed on the current spreading layer 820.

While the present invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A light receiving device comprising:
a photoelectric conversion layer which absorbs light to generate electric energy; and
a transparent electrode which is formed to be in contact with the photoelectric conversion layer to allow external light to transmit into the photoelectric conversion layer,
wherein the transparent electrode comprises conducting filaments and a transparent insulating material, wherein the transparent insulating material is formed of a first material and the conducting filaments are formed of the first material,
wherein the transparent electrode is formed by applying a threshold voltage or more inherent in the transparent insulating material to the transparent electrode to form a defective structure, so that the conducting filaments are formed in the transparent electrode, and
wherein the resistance state of the transparent electrode is to be changed from a high resistance state into a low resistance state by the conducting filaments through which current flow.

2. The light receiving device according to claim 1, wherein the transparent electrode is formed by using any one of a transparent oxide based material, a transparent nitride based material, a transparent polymer based material, and a transparent nano material.

3. The light receiving device according to claim 1, further comprising a current spreading layer which is formed by using carbon nano tube (CNT) or graphene between the photoelectric conversion layer and the transparent electrode.

4. The light receiving device according to claim 1, further comprising a current spreading layer which is formed by using CNT or graphene and is in contact with a surface of the transparent electrode opposite to a surface of the transparent electrode which is in contact with the photoelectric conversion layer.

5. The light receiving device according to claim 1, further comprising an opposite electrode which is formed to be in contact with a surface of the photoelectric conversion layer opposite to a surface of the photoelectric conversion layer which is in contact with the transparent electrode.

6. The light receiving device according to claim 1, wherein the photoelectric conversion layer is formed by sequentially forming a first semiconductor layer, an activation layer, and a second semiconductor layer which is in contact with the transparent electrode, a first electrode pad is formed on the first semiconductor layer, and a second electrode pad is formed on the transparent electrode.

* * * * *